United States Patent
Zhang et al.

(10) Patent No.: US 12,200,923 B2
(45) Date of Patent: Jan. 14, 2025

(54) METHOD OF FABRICATING SEMICONDUCTOR DEVICE HAVING BIT LINE COMPRISING A PLURALITY OF PINS EXTENDING TOWARD THE SUBSTRATE

(71) Applicant: Fujian Jinhua Integrated Circuit Co., Ltd., Quanzhou (CN)

(72) Inventors: Janbo Zhang, Quanzhou (CN); Li-Wei Feng, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 8 days.

(21) Appl. No.: 18/219,722

(22) Filed: Jul. 10, 2023

(65) Prior Publication Data

US 2023/0354583 A1    Nov. 2, 2023

Related U.S. Application Data

(62) Division of application No. 17/336,325, filed on Jun. 2, 2021, now Pat. No. 11,744,062.

(30) Foreign Application Priority Data

May 8, 2021  (CN) .......................... 202110499195.9
May 8, 2021  (CN) .......................... 202120968517.5

(51) Int. Cl.
*H10B 12/00*   (2023.01)
*H01L 27/092*  (2006.01)
(Continued)

(52) U.S. Cl.
CPC ......... *H10B 12/36* (2023.02); *H01L 27/0924* (2013.01); *H01L 29/0649* (2013.01); *H01L 29/6656* (2013.01); *H10B 12/056* (2023.02)

(58) Field of Classification Search
CPC ...... H10B 12/056; H10B 12/34; H10B 12/36; H10B 12/315; H10B 12/482; H01L 27/0924; H01L 29/0649; H01L 29/6656
See application file for complete search history.

(56) References Cited

U.S. PATENT DOCUMENTS 9,508,726 B2   11/2016  Son
10,644,006 B1   5/2020  Ha
(Continued)

FOREIGN PATENT DOCUMENTS

CN    108962907 A  *  12/2018  ........ H01L 27/11568

*Primary Examiner* — Nelson Garces
(74) *Attorney, Agent, or Firm* — Winston Hsu (57) ABSTRACT

The present disclosure relates to a method of fabricating a semiconductor device, the semiconductor device includes a substrate, a plurality of gate structures, a plurality of isolation fins, and at least one bit line. The gate structures are disposed in the substrate, with each of the gate structures being parallel with each other and extending along a first direction. The isolation fins are disposed on the substrate, with each of the isolation fins being parallel with each other and extending along the first direction, over each of the gate structures respectively. The at least one bit line is disposed on the substrate to extend along a second direction being perpendicular to the first direction. The at least one bit line comprises a plurality of pins extending toward the substrate, and each of the pins is alternately arranged with each of the isolation fins along the second direction.

7 Claims, 7 Drawing Sheets

(51) Int. Cl.
*H01L 29/06* (2006.01)
*H01L 29/66* (2006.01)

(56) References Cited

U.S. PATENT DOCUMENTS

| | | |
|---|---|---|
| 10,707,216 B2 | 7/2020 | Yoon |
| 2020/0203352 A1 | 6/2020 | Im |
| 2021/0098460 A1* | 4/2021 | Lee ..................... H10B 12/053 |
| 2022/0157957 A1* | 5/2022 | Jin ................. H01L 21/823871 |

* cited by examiner

METHOD OF FABRICATING SEMICONDUCTOR DEVICE HAVING BIT LINE COMPRISING A PLURALITY OF PINS EXTENDING TOWARD THE SUBSTRATE

CROSS REFERENCE TO RELATED APPLICATIONS

This application is a division of U.S. application Ser. No. 17/336,325, filed on Jun. 2, 2021. The content of the application is incorporated herein by reference.

BACKGROUND OF THE INVENTION

1. Field of the Invention

The present disclosure generally relates to a semiconductor device and a method of fabricating the same, and more particularly, to a semiconductor memory device and a method of fabricating the same.

2. Description of the Prior Art

A dynamic random access memory (DRAM) device is one kind of volatile memory that has been widely incorporated as an essential portion in many electronics. A conventional DRAM device may include plural memory cells arranged into an array for data storage. Each memory cell may include a metal oxide semiconductor (MOS) transistor and a capacitor serially connected to the MOS transistor.

As the dimension of a DRAM device continues to shrink for higher integrity, it has been more and more difficult to fabricate the interconnecting structure for electrically connecting the memory cells. Meanwhile, various cell designs for forming DRAM devices that may have the transistors and capacitors configured structurally differently are still required to fulfill product needs and achieve a higher device density. Therefore, it is still intensively studied in the field to provide a DRAM device with improved performance and a fabricating method thereof.

SUMMARY OF THE INVENTION

One of the objectives of the present disclosure provides a semiconductor device and a fabricating method thereof, in which the semiconductor device includes a comb-shaped or fence-shaped bit line having pins optionally connected or not connected to a transistor, so as to provide better functions and performances. Furthermore, the comb-shaped or the fence-shaped bit line of the semiconductor device may be fabricated through a dual damascene process, and the fabrication of the semiconductor device may be achieved through a fast and convenient process flow for saving times and costs.

To achieve the purpose described above, one embodiment of the present disclosure provides a semiconductor device including a substrate, a plurality of gate structures, a plurality of isolation fins, and at least one bit line. The gate structures are disposed in the substrate, with each of the gate structures being parallel with each other and extending along a first direction. The isolation fins are disposed on the substrate, with each of the isolation fins being parallel with each other and extending along the first direction, over each of the gate structures respectively. The at least one bit line is disposed on the substrate to extend along a second direction being perpendicular to the first direction. The at least one bit line comprises a plurality of pins extending toward the substrate, and each of the pins is alternately arranged with each of the isolation fins along the second direction.

To achieve the purpose described above, one embodiment of the present disclosure provides a fabricating method of a semiconductor device including the following steps. Firstly, a substrate is provided, and a plurality of gate structures is formed in the substrate, with each of the gate structures being parallel with each other and extending along a first direction. Next, a plurality of isolation fins is formed on the substrate, with each of the isolation fins being parallel with each other and extending along the first direction, over each of the gate structures respectively. Then, at least one bit line is formed on the substrate, extending along a second direction being perpendicular to the first direction. The at least one bit line includes a plurality of pins extending toward the substrate, and each of the pins is alternately arranged with each of the isolation fins along the second direction.

To achieve the purpose described above, one embodiment of the present disclosure provides another semiconductor device including a substrate, an insulating layer, and a plurality of gate structures. The insulating layer is disposed on the substrate, and the gate structures are disposed on the insulating layer, wherein the gate structures includes a first gate structure disposed over the substrate, and a second gate structure partially extended within the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating a semiconductor device according to a preferable embodiment in the present disclosure, wherein:

FIGS. 3-13 are schematic diagrams illustrating a fabrication method of a semiconductor device according to a preferable embodiment in the present disclosure, wherein:

DETAILED DESCRIPTION

To provide a better understanding of the presented disclosure, preferred embodiments will be described in detail.

The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
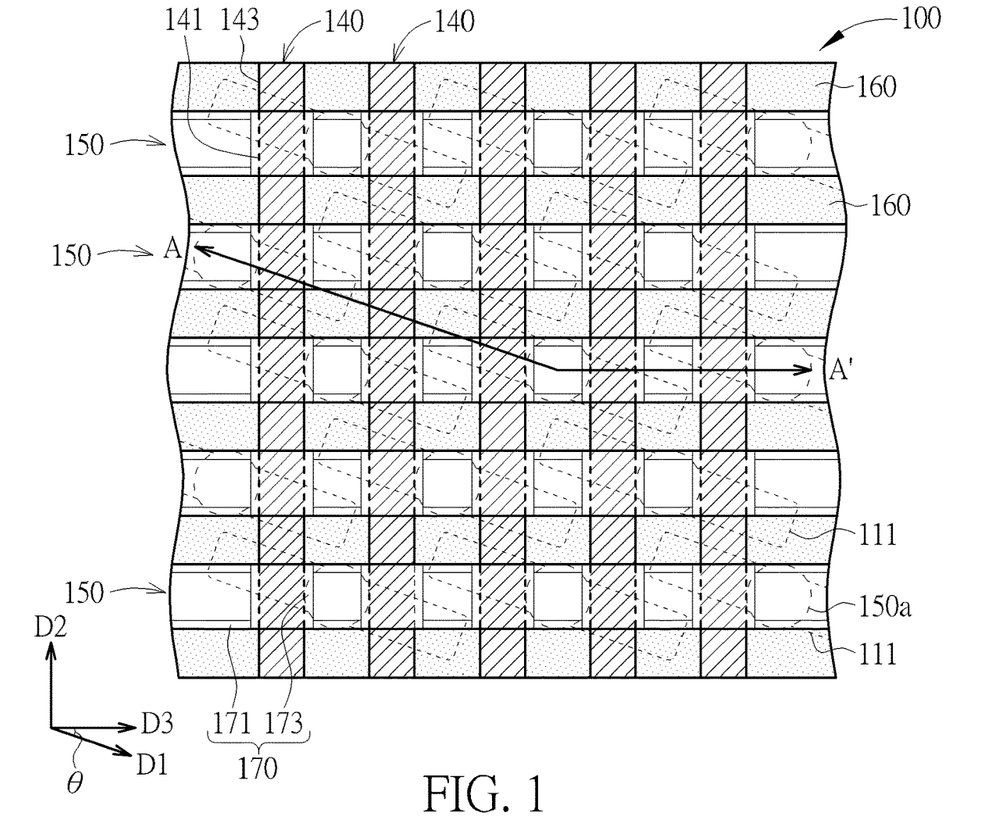
FIG. 1 shows a top view of a semiconductor device.
Figure 2:
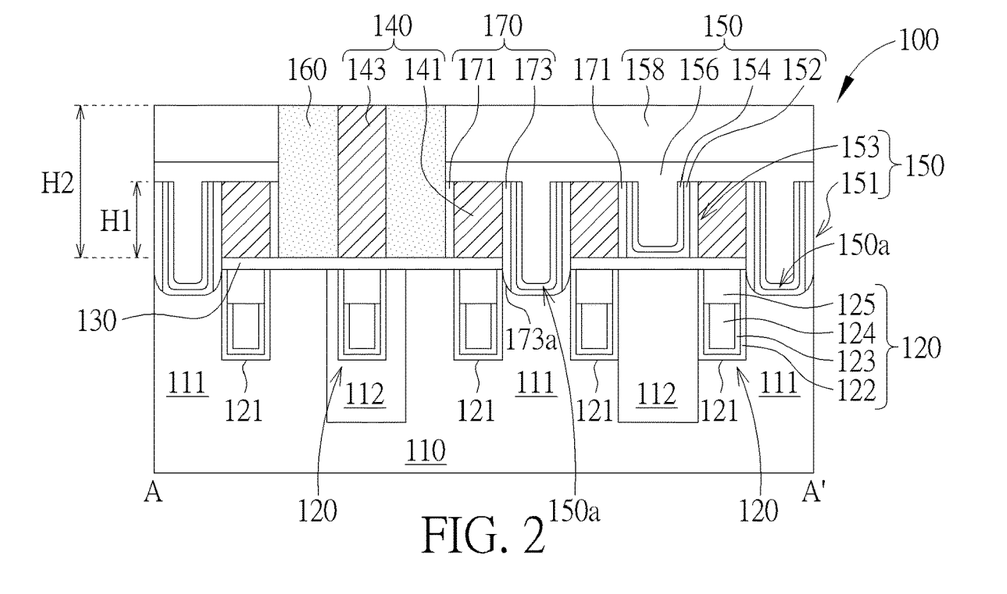
FIG. 2 shows a cross-sectional view taken along a cross line A-A' in FIG. 1.

Please refers to FIGS. 1-2, which illustrate schematic diagrams of a semiconductor device 100 according to the preferably embodiment in the present disclosure, with FIG. 1 and FIG. 2 respectively illustrating a top view and a cross-sectional view of the semiconductor device 100. In the present embodiment, the semiconductor device 100 is for example a dynamic random access memory (DRAM) device including at least one transistor structure (not shown in the drawings) and at least one capacitor structure (not shown in the drawings) for accepting signals from bit lines (BLs) and word lines (WLs) during the operation.

The semiconductor device 100 includes a substrate 110 such as a silicon substrate, an epitaxial silicon substrate or a silicon on insulation (SOI) substrate, and at least one shallow trench isolation (STI) 112 is disposed in the substrate 110, to define a plurality of active areas (AAs) 111 in the substrate 110. In one embodiment, the active areas 111 are parallel with each other to extend along a direction D1, and preferably, the direction D1 is not perpendicular to the y-direction (such as a direction D2) or the x-direction (such as a direction D3), for example having an included angle θ about 30-120 degrees to the y-direction (such as the direction D2) or the x-direction (such as the direction D3) as shown in FIG. 1, but not limited thereto.

A plurality of gate structures 120 is disposed within the substrate 110 to serve as buried word lines (BWLs) for receiving and transmitting signals of each memory cell of the semiconductor device 100, wherein the gate structures 120 are parallel with each other and extend along the direction D2. In the present embodiment, the formation of the gate structure 120 is but not limited to be accomplished by the following processes. Firstly, a plurality of trenches 121 which are parallel with each other to extend along the direction D2 is formed within the substrate 110, and an interface dielectric layer 122, a gate dielectric layer 123, a gate electrode layer 124, and a mask layer 125 are sequentially formed in each trench 121 to form each of the gate structures 120. As shown in FIG. 2, the interface dielectric layer 122 is formed by entirely covering surfaces of each trench 121, followed by forming the gate dielectric layer 123 and the gate electrode layer 124 filled in a bottom portion of each trench 121, and forming the mask layer 125 filled in a top portion of each trench 121, over the gate dielectric layer 123 and the gate electrode layer 124. It is noted that, the mask layer 125 has a topmost surface (not marked in the drawings) leveled with a topmost surface (not marked in the drawings) of the substrate 110, and each of the gate structures 120 may be therefore embedded in the substrate 110.

Next, an isolating layer 130, preferably including an oxide-nitride-oxide (ONO) structure, is disposed on the topmost surface of the substrate 110, and a plurality of isolation fins 140 and a plurality of bit lines 150 are disposed over the isolating layer 130. Precisely speaking, the isolation fins 140 are also parallel with each other and extend along the direction D2, with each of the isolation fins 140 being in alignment with each of the gate structures 120 disposed underneath in a projecting direction (not shown in the drawings) of the substrate 110, and the bit lines 150 are parallel with each other and extend along the direction D3, to cross over a portion of each of the isolation fins 140, as shown in FIG. 1. Moreover, with reference to FIG. 2, a portion the isolation fins 141 which is namely the aforementioned portion being crossed by the bit lines 150 has a relative smaller height H1 in the projection direction, and the portion of the isolation fins 141 is disposed under the bit lines 150 to overlap with thereto. On the other hand, another portion the isolation fins 143 which is not crossed by the bit lines 150 has a relative greater height H2 in the projection direction, and the another portion of the isolation fins 143 obviously not overlaps with the bit lines 150, as shown in FIGS. 1-2. It is also noted that, each of the bit lines 150 includes a plurality of pins 151, 153 extended toward the substrate 110 along the projection direction, and each of the pins 151, 153 are alternately arranged with each of the isolation fins 140 along the direction D3. As shown in FIG. 2, each of the pins 151 further extends into the substrate 110 to directly in contact thereto, with a bottommost surface of each pin 151 being lower than the topmost surface of the substrate 110, and the pins 153 only extends over the substrate 110 and disposed on the insulating layer 130, without directly in contact with the substrate 110. Accordingly, the bottom of the pins 151 of the bit lines 150 may function like bit line contacts (BLCs) 150a, and which is disposed below the bit lines 150 to electrically connect the transistor structure of the semiconductor device 100 for receiving or transmitting signals. In other words, the bit line contacts 150a and the bit lines 150 of the semiconductor device are namely monolithic.

On the other hand, each of the bit lines 150 further includes a semiconductor layer 152, a barrier layer 154, a conductive layer 156, and a mask layer 158 sequentially stacked from bottom to top. Preferably, the bit lines 150 may be formed through a process like the replacement metal gate process, thus that the semiconductor layer 152 and the barrier layer 154 may respectively include a U-shaped structure accordingly and the conductive layer 156 may filled up the bottom portion of each bit line trench to connect the pins 151, 153, as shown in FIG. 2. The semiconductor layer 152 for example includes polysilicon or other suitable semiconductor materials. The barrier layer 154 for example includes titanium (Ti) or titanium nitride (TiN), and the conductive layer 156 for example includes a low resistant metal like tungsten (W), aluminum (Al) or copper (Cu), and the mask layer 158 for example includes silicon oxide ($SiO_x$), silicon nitride (SiN), silicon oxynitride (SiON), or silicon carbonitride (SiCN), but not limited thereto.

Furthermore, the semiconductor device 100 further includes a plurality of isolation structures 160 and a plurality of spacers 170, wherein the spacers 170 are disposed on sidewalls of the bit lines 150 and sidewalls of the isolation fins 140, and the isolation structures 160 are disposed within the rest gaps between the isolation fins 140 and the bit lines 150, over the insulating layer 130. Precisely speaking, spacers 171 are disposed on the sidewalls of the bit lines 150 along the direction D3, and spacers 173 are partially disposed on the sidewalls of the isolation fins 140 along the direction D2 as shown in FIG. 1. Accordingly, the spacers 171 may be disposed between the isolation structures 160 and the bit lines 150, and the spacers 173 may be disposed between the portion of the isolation fins 141 and the pins 151, 153 of the bit lines 150), with a portion of the spacers 173 further extending into the substrate 110 by the pins 151 to obtain a bottommost surface 173a also lower than the topmost surface of the substrate 110, as shown in FIG. 2. In one embodiment, the spacers 171, 173 may respectively include a monolayer structure as shown in FIGS. 1-2, or include a multilayer structure for example at least having a first spacer layer (not shown in the drawing) and a second spacer layer (not shown in the drawing) stacked on the first spacer layer, but not limited thereto.

It is noted that, as shown in FIG. 1, the isolation structures 160 are disposed at two opposite sides of each bit line contact 150a along the direction D2, and the isolation fins 140 are disposed at two opposite sides of each bit line contact 150a along the direction D3, and a topmost surface of the isolation structures 160 is substantially the same as that of the another portion the isolation fins 143, and which is significantly higher than that of the portion of the isolation fins 141 (with reference to FIG. 2). Preferably, the isolation structures 160 and the isolation fins 140 may include different dielectric materials with etching selectivity, for example being selected from silicon oxide, SiN, SiON, SiCN and other suitable materials. In the present embodiment, the isolation fins 140 may include SiN and the isolation structures 160 may include silicon oxide, but not limited thereto.

Through this arrangement, each of the bit lines 150 within the semiconductor device 100 of the present embodiment may obtain a comb shaped or a fence shaped structure with the pins 151, 153 of the bit lines 150 optionally in contact or not in contact with the substrate 110, so as to provide better functions and performances. It is noteworthy that each pin 151 of each bit line 150 may serve as a bit line contact 150a also known as a bit line gate structure for receiving or transmitting signals, and each pin 153 of each bit line 150 may serve as a dummy bit line gate structure, wherein the bit line gate structure (namely the pin 151 being extended into the substrate 110) and the dummy bit line gate structures (namely the pins 153 being extended over the substrate) respectively include the U-shaped semiconductor layer 152, the U-shaped barrier layer 154, and the conductive layer 156 stacked from bottom to top with the spacer 173/171 respectively surrounding the bit line gate structure (namely the pin 151) and the dummy bit line gate structure (namely the pins 153), and the bit line gate structure (namely the pin 151) and the dummy bit line gate structures (namely the pins 153) are separately disposed from each other by the portion of the isolation fins 141. However, the bit line gate structure (namely the pin 151) and the dummy bit line gate structures (namely the pins 153) are in connection with each other through the conductive layer 156, and a connection portion of the conductive layer 156 is disposed over the portion of the isolation fins 141 for connecting the conductive layers 156 of the bit line gate structure (namely the pin 151) and the dummy bit line gate structure (namely the pins 153). Due to these arrangements, each bit line 150 of the semiconductor device 100 may be fast and conveniently fabricated through a simplified process flow for saving times and costs.

In order to enable one of ordinary skill in the art to implement the present disclosure, a fabricating method of a semiconductor device 100 of the present disclosure is further described below. Please refer to FIGS. 3-13, which respectively illustrates the forming processes of the semiconductor device 100 according to a preferable embodiment in the present disclosure are illustrated, wherein FIG. 3 and FIG. 5 are top views of a semiconductor device 100 during the forming processes, FIG. 4 and FIG. 6 are cross-sectional views taken along cross lines B-B', C-C' in FIG. 3 and FIG. 5, and other drawings are cross-sectional views of a semiconductor device 100 during the forming processes.

Figure 3:
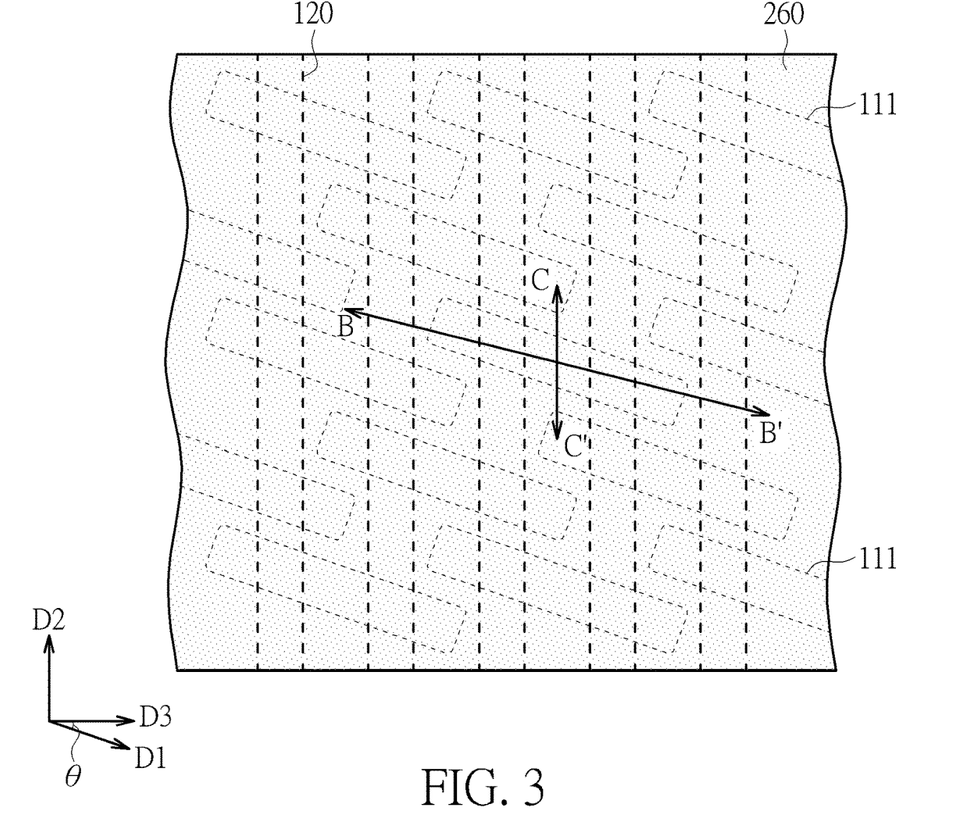
FIG. 3 shows a top view of a semiconductor device after forming an isolation layer.
Figure 4:
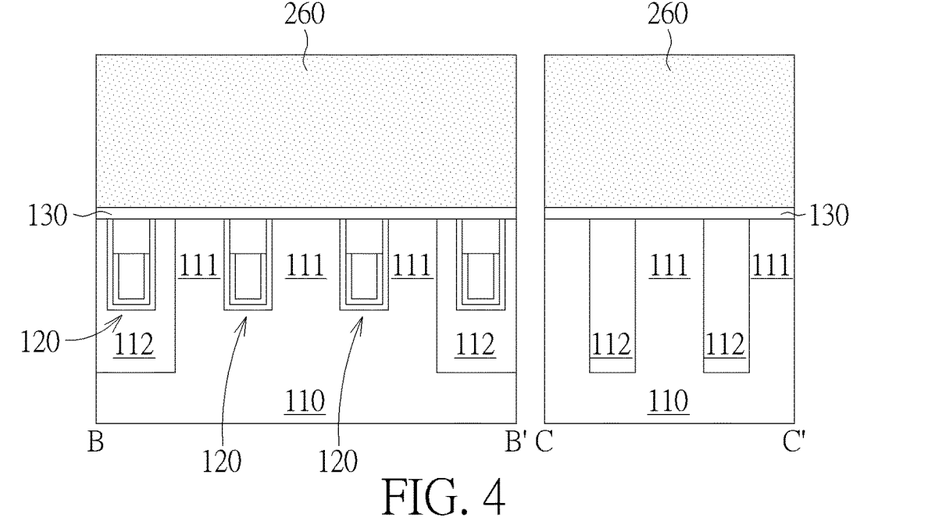
FIG. 4 shows a cross-sectional view taken along cross lines B-B', C-C' in FIG. 3.

Firstly, as shown in FIGS. 3-4, the substrate 110 is provided, with the substrate 110 having the STI 112 and the active areas 111 formed therein, and the gate structures 120 is formed in the substrate 110 and the insulating layer 130 is formed on the substrate 110, with top surfaces of the gate structures 120 being coplanar with the topmost surface of the substrate 110, and with the insulating layer 130 covering the active areas 111, the STI 112, and the gate structures 120. It is noted that, the detailed features of the gate structures 120, as well as the formation thereof have been mentioned above and which may not be redundantly described hereinafter. Also, an isolation layer 260, for example including a dielectric material like silicon oxide, SiN, SiON or SiCN, is entirely formed on the isolating layer 130, for covering all of the active areas 111 and the STI 112 underneath. In the present embodiment, the isolation layer 260 preferably includes silicon oxide, but is not limited thereto.

Figure 5:
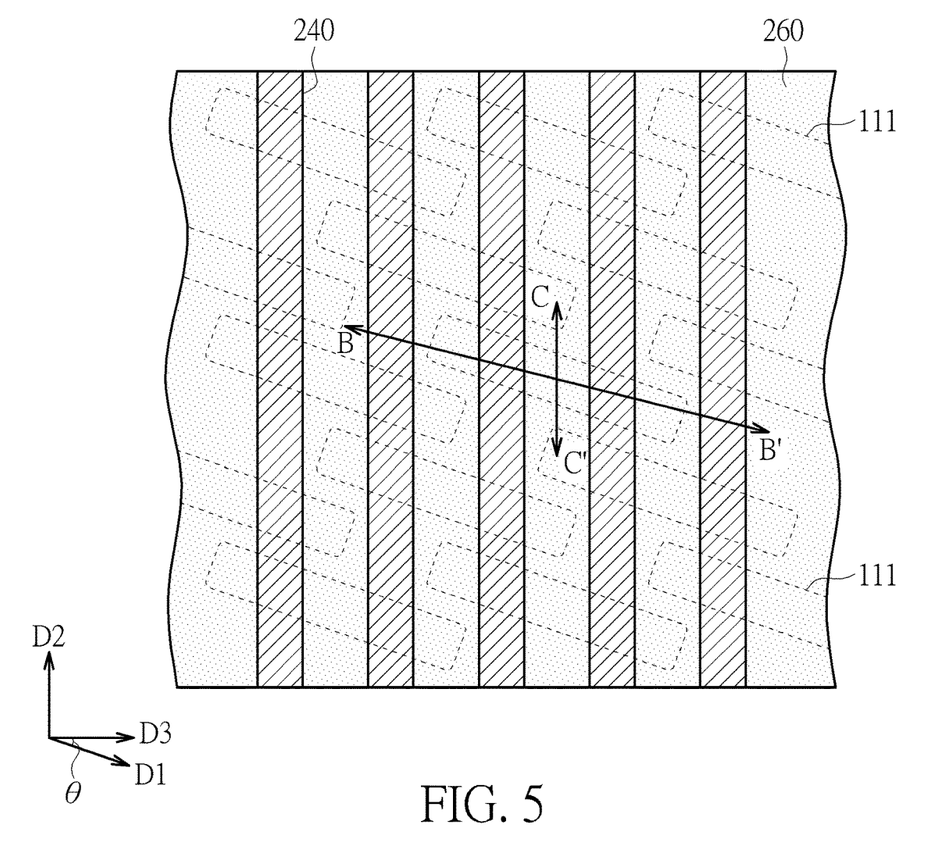
FIG. 5 shows a top view of a semiconductor device after forming isolation fins.
Figure 6:
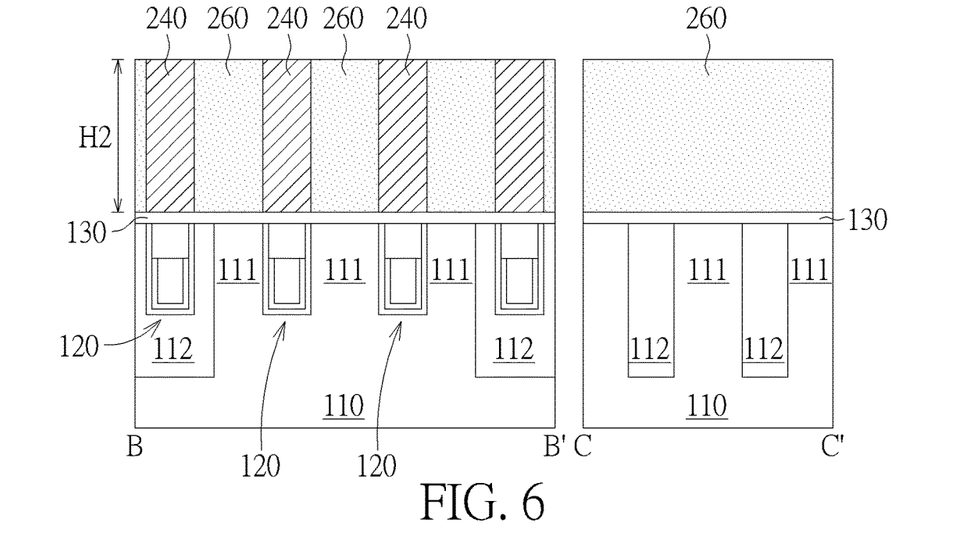
FIG. 6 shows a cross-sectional view taken along cross lines B-B', C-C' in FIG. 5.

Next, as shown in FIGS. 5-6, a plurality of isolation fins 240 are formed within the isolation layer 260 to extend along the direction D2. In one embodiment, the formation of the isolation fins 240 may be carried out by firstly removing a portion of the isolation layer 260 to form a plurality of trenches (not shown in the drawing) in the isolation layer 260, with each of the trenches being parallel with each other and extending along the direction D2 to partially expose the isolating layer 130 underneath, and filling a dielectric material in the trenches to form the isolation fins 240 having coplanar top surfaces with the isolation layer 260. Accordingly, the isolation fins 240 may obtain the same height as the isolation layer 260, such as the height H2 as shown in FIG. 6. The dielectric material of the isolation fins 240 may be silicon oxide, SiN, SiON or SiCN, but is not limited thereto. Preferably, the dielectric material of the isolation fins 240 may have an etching selectivity with respect to the dielectric material of the isolation layer 260, for example the dielectric materials of the isolation fins 240 and the isolation layer 260 respectively may include SiN and $SiO_2$, but not limited thereto.

Figure 7:
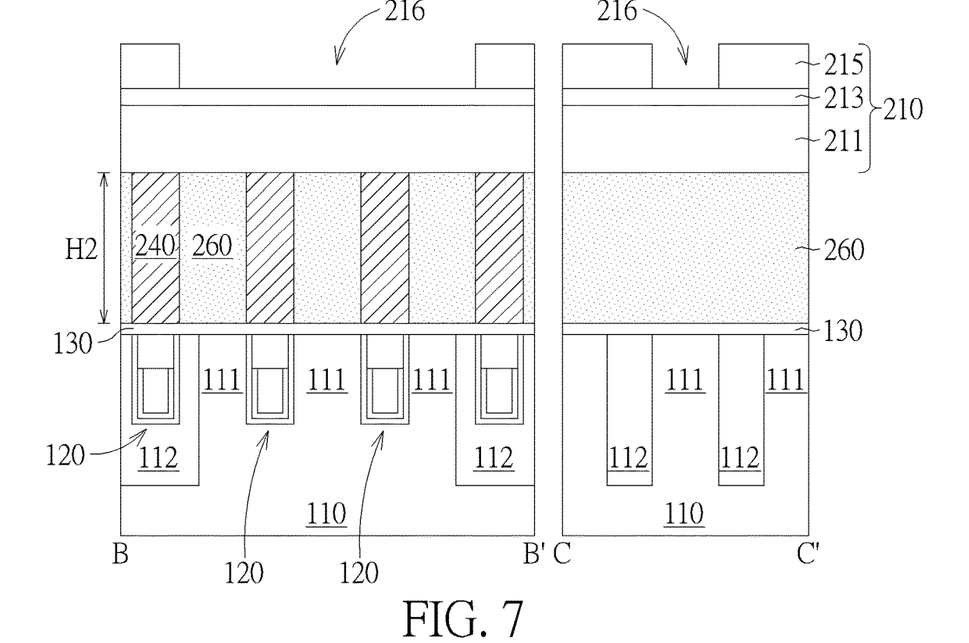
FIG. 7 shows a cross-sectional view of a semiconductor device after forming a first photoresist structure.
Figure 8:
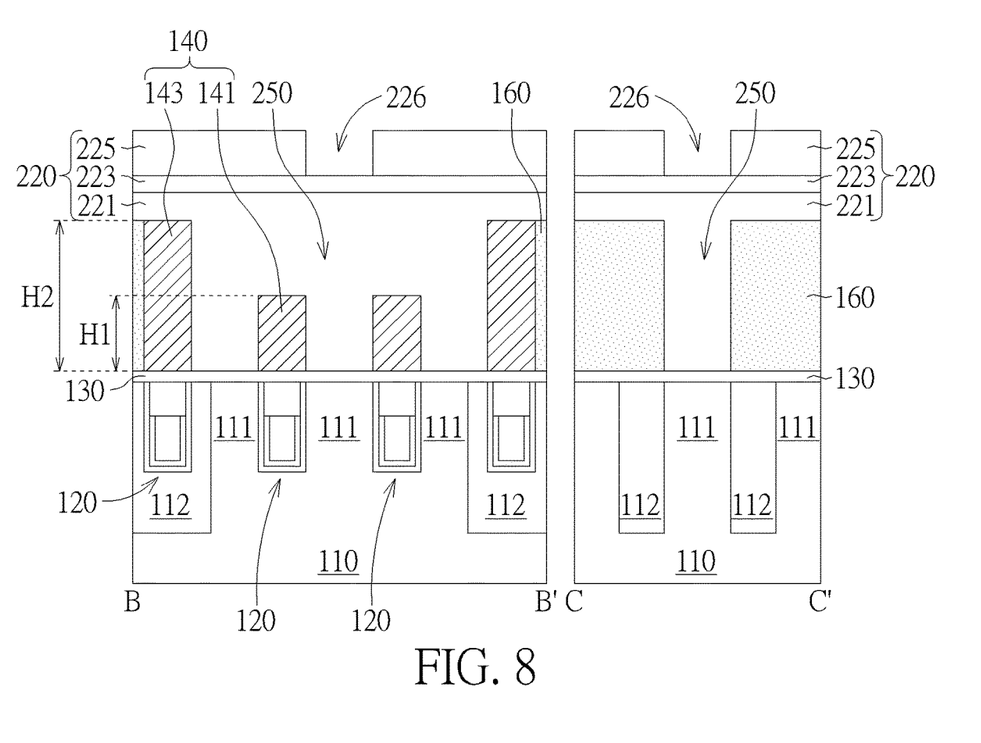
FIG. 8 shows a cross-sectional view of a semiconductor device after forming a second photoresist structure.
Figure 9:
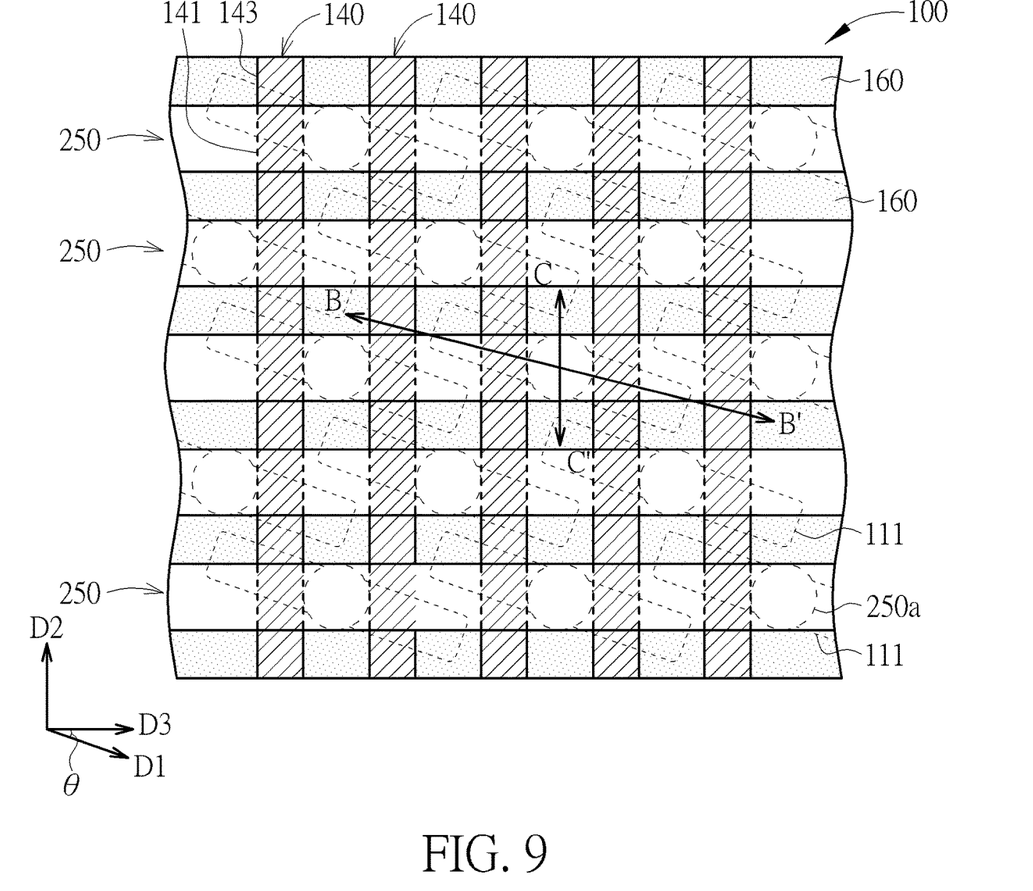
FIG. 9 shows a top view of a semiconductor device after forming openings.
Figure 10:
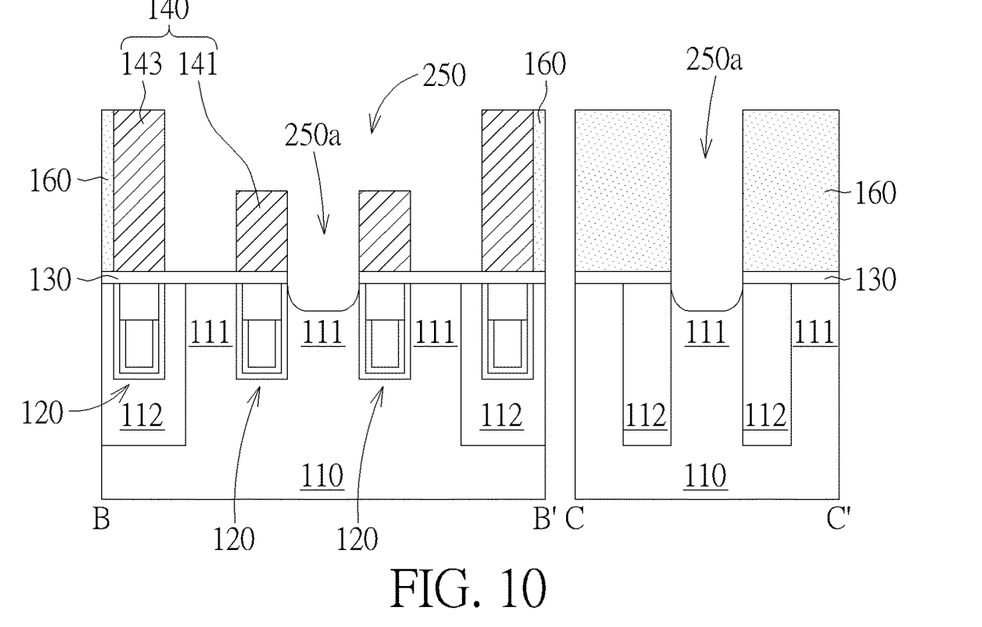
FIG. 10 shows a cross-sectional view taken along cross lines B-B', C-C' in FIG. 9.

In the following processes, at least one bit line trench is formed followed by forming at least one bit line 150 within the bit line trench. As shown in FIGS. 7-10, at least one trench opening 250 and at least one via opening 250a are sequentially defined and formed to consist the bit line trench. In one embodiment, the trench opening 250 and the via opening 250a may be formed through a dual damascene process such as a trench first damascene process. Precisely speaking, a first photoresist structure 210 is firstly formed over the substrate 110 for defining the trench opening 250, with the first photoresist structure 210 including a sacrificial layer 211 such as an organic dielectric layer (ODL), an anti-reflective layer 213 such as a dielectric anti-reflective coating (DARC) layer, and a first photoresist layer 215 stacked from one over another as shown in FIG. 7, and at least one etching process (not shown in the drawings) is performed by transferring trench patterns 216 of the first photoresist layer 215 into the anti-reflective layer 213, the sacrificial layer 211, the isolation layer 260, and the isolation fins 240 underneath, to form the trench opening 250. Meanwhile, after the etching process, remained isolation layer 260 form the isolation structure 160 as shown in FIG. 8. Also, the etching process is performed by using the isolating layer 130 as an etch stop layer, so that a portion of the isolating layer 130 may be exposed from the trench opening 250 as shown in FIGS. 8 and 10. On the other hand due to the etching selectivity between the dielectric materials of isolation layer 260 and the isolation fins 240, the isolation fins 240 exposed from the trench pattern 216 may be partially etched instead of completely etched, thereby obtaining the isolation fins 141 with a reduced height H1 as in comparison with the height H2 of rest portions of the isolation fins 143.

After forming the trench opening 250, the first photoresist structure 210 is completely removed, and a second photoresist structure 220 is then formed for defining the via opening 250a. As shown in FIG. 8, the second photoresist structure 220 also includes a sacrificial layer 221 such as an ODL, an anti-reflective layer 223 such as a DARC layer, and a second photoresist layer 225 stacked from one over another, with the sacrificial layer 221 filling in the trench opening 250 to obtain a planar top surface, and another etching process is performed to transfer via patterns 226 of the second photoresist layer 225 into the anti-reflective layer 223, the sacrificial layer 221, the insulating layer 130 and a portion of the substrate 110, to form the via opening 250a as shown in FIGS. 9-10. It is noted that the via opening 250a further extends into the substrate 100 to expose the substrate 110 therefrom. People in the art should fully understand that, in another embodiment, the aforementioned via opening 250a and the trench opening 250 may also be formed through a via first damascene process (not shown in the drawings) due to practical product requirements. Besides, people in the art should also understand that, although only one single trench opening 250 and one single via opening 250a is illustrated in FIGS. 7-9, the practical number of the trench opening 250 and the via opening 250a is not limited thereto and which may be adjustable due to practical device requirement. For example, a plurality of the trench openings 250 and a plurality of the via opening 250a may be formed while being seen from a top view as shown in FIG. 8 to consist a plurality of the bit line trenches, and also, the practical number of the bit line trenches is based on the request number of bit lines 150 in the device.

Figure 11:
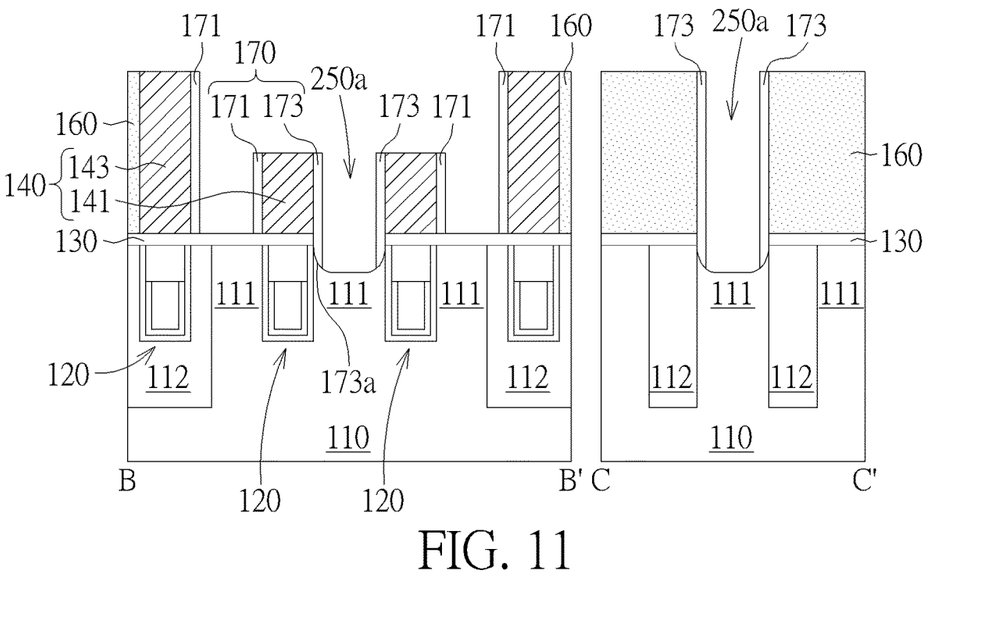
FIG. 11 shows a cross-sectional view of a semiconductor device after forming spacers.

Next, as shown in FIG. 11, spacers 170 are formed on sidewalls of the bit line trench (namely, sidewalls of the trench opening 250 and the via opening 250a), and which may include a dielectric material like silicon oxide, SiN, SiON, SiCN or other suitable materials. In one embodiment, the spacers 170 may include a monolayer structure, and the formation thereof may but not limited to be accomplished by firstly depositing a dielectric material layer (not shown in the drawings) on the substrate 110, covering all exposing surfaces thereof, and performing an etching back process to remove the dielectric material layer disposed on horizontal surfaces, thereby remaining the spacers 171, 173 either between the bit line trench and the isolation fins 140 or between the bit line trench and the isolation structures 160. However, in another embodiment, the spacers may also include a multilayer structure, and the formation thereof may be accomplished by similar steps above. It is noted that, the spacers 171 disposed on sidewalls of the via trenches 250 are formed over the insulating layer 130, without directly in contact with the substrate 110, and the spacers 173 disposed on sidewalls of the via opening 250a may further extend into the substrate 110, to directly in contact with the substrate 110, with the spacers 173 having the bottommost surface 173a lower than the topmost surface of the substrate 110.

Figure 12:
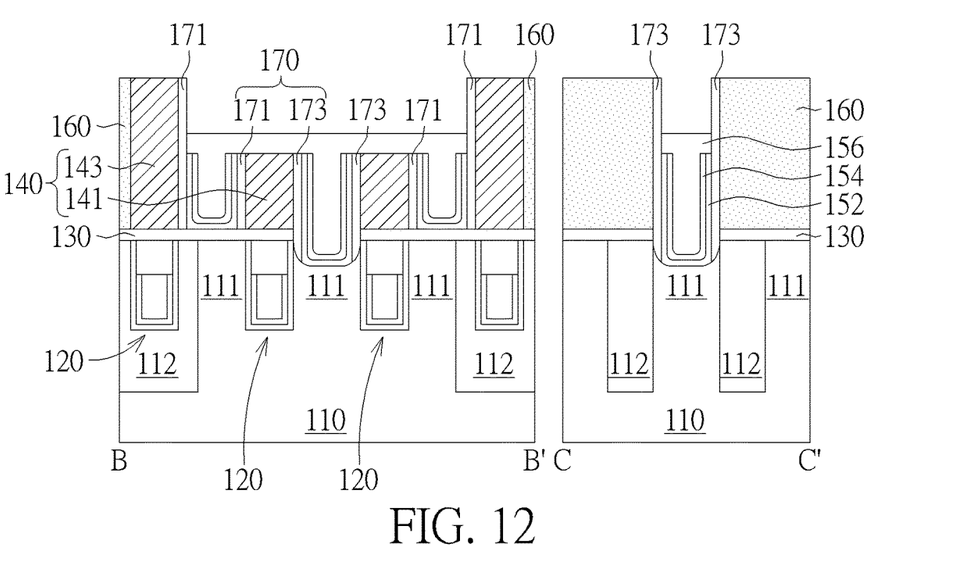
FIG. 12 shows a cross-sectional view of a semiconductor device after forming a conductive layer.
Figure 13:
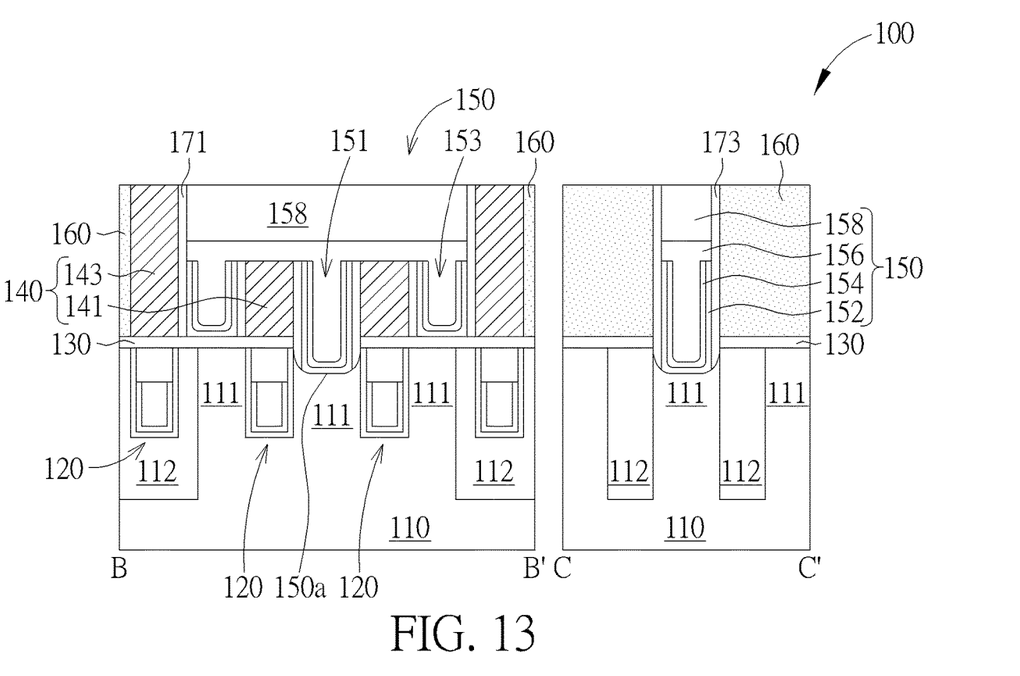
FIG. 13 shows a cross-sectional view of a semiconductor device after forming a mask layer.

Finally, as shown in FIGS. 12-13, at least one bit line 150 is formed to fill in the bit line trench for example through a process like the replacement metal gate process. Precisely speaking, the formation of the bit line 150 is carried out by sequentially forming a semiconductor material layer (not shown in the drawings) and a barrier material layer (not shown in the drawings) conformally over the substrate 110, performing an etching back process to remove the semiconductor material layer and the barrier material layer to form the semiconductor layer 152 and the barrier layer 154 on surfaces of the trench openings 250 and via openings 250a in a U-shape as shown in FIG. 12, and then, filling the conductive layer 156 in the bottom of each bit line trench. However, people in the art should fully understand that in another embodiment, the etching back process of the semiconductor material layer the barrier material layer may also be omitted, so as to form a conformal and continuously extended semiconductor layer (not shown in the drawings) and barrier layer (not shown in the drawings) within the bit line trench. It is noted that the semiconductor layer 152, the barrier layer 154, and the conductive layer 156 filled in the via opening 250a form the pins 151 of each bit line 150, to directly in contact with the substrate 110, the semiconductor layer 152, the barrier layer 154, and the conductive layer 156 filled in the trench opening 250 form the pins 153 of each bit line 150, to not directly in contact with the substrate 110, wherein each of the pins 151, 153 are connected with each other by the conductive layer 156 as shown in FIG. 12. Following these, the mask layer 158 is formed to fill in the top portion of each bit line trench, thereby consisting each of the bit lines 150. Accordingly, the bit line 150 may therefor obtain a comb-shaped structure or a fence-shaped structure while being seen in a cross-section view like FIG. 13, with the pins 151, 153 optionally extended into the substrate 110 to electrically connect thereto, and with the pin 151 being disposed between two adjacent pins 153 but not limited thereto.

Accordingly, the semiconductor device 100 of the preferably embodiment in the present disclosure may be obtained thereby, with the at least one bit line 150 performing like a comb-shaped structure or a fence-shaped structure to achieve better functions and performance. Due to the above-mentioned fabricating method, the comb-shaped bit lines or the fence-shaped bit lines may be formed by using a dual damascene process, in which, the trench opening 250 and via opening 250a may sequentially formed in the isolation layer 260 to consist the bit line trench, and each of the bit lines 150 may be formed then in the bit line trench. In this way, the comb-shaped or fence-shaped bit lines may have the pins 151 for directly contacting the substrate 110 and the pins 153 without contacting the substrate 110, and with the pins 151, 153 in connection with each other by the conductive layer 156, and with an connection portion of the conductive layer 156 directly disposed on the portion of the isolation fins 141 to overlap with thereto. Thus, the semiconductor device 100 of the present embodiment may be formed through a simplified process flow for saving times and costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a semiconductor device, comprising:
   providing a substrate;
   forming a plurality of gate structures in the substrate, each of the gate structures being parallel with each other and extending along a first direction;
   forming a plurality of isolation fins on the substrate, each of the isolation fins being parallel with each other and extending along the first direction, over each of the gate structures respectively; and
   forming at least one bit line on the substrate, extending along a second direction being perpendicular to the first direction, wherein the at least one bit line comprises a plurality of pins extending toward the substrate, and each of the pins is alternately arranged with each of the isolation fins along the second direction, wherein the at least one bit line comprises a semiconductor layer, a barrier layer, and a conductive layer stacked from bottom to top and the semiconductor layer and the barrier layer comprise a U-shape structure.

2. The fabricating method of the semiconductor device according to claim 1, wherein a portion of the isolation fins are formed between the pins of the at least one bit line.

3. The fabricating method of the semiconductor device according to claim 1, wherein the pins comprise a plurality of first pins and a plurality of second pins, the first pins not directly contact the substrate, the second pins directly contacts the substrate, and the first pins and the second pins are formed through a dual damascene process.

4. The fabricating method of the semiconductor device according to claim 1, further comprising:
    forming a first spacer structure on sidewalls of the at least one bit line; and
    forming a second spacer on sidewalls of the isolation fins, wherein the first spacer and the second spacer are simultaneously formed.

5. The fabricating method of the semiconductor device according to claim 4, wherein the forming of the first spacer and the second spacer is before the forming of the at least one bit line.

6. The fabricating method of the semiconductor device according to claim 4, wherein a portion of the second spacer is disposed within the substrate and a bottommost surface of the portion of the second spacer is lower than a top surface of the substrate.

7. A fabricating method of a semiconductor device, comprising:
    providing a substrate;
    forming a plurality of gate structures in the substrate, each of the gate structures being parallel with each other and extending along a first direction;
    forming a plurality of isolation fins on the substrate, each of the isolation fins being parallel with each other and extending along the first direction, over each of the gate structures respectively;
    forming at least one bit line on the substrate, extending along a second direction being perpendicular to the first direction, wherein the at least one bit line comprises a plurality of pins extending toward the substrate, and each of the pins is alternately arranged with each of the isolation fins along the second direction; and
    forming a first spacer structure on sidewalls of the at least one bit line; and
    forming a second spacer on sidewalls of the isolation fins, wherein the first spacer and the second spacer are simultaneously formed, and a portion of the second spacer is disposed within the substrate and a bottommost surface of the portion of the second spacer is lower than a top surface of the substrate.

* * * * *